United States Patent [19]
Liang et al.

[11] Patent Number: 5,332,864
[45] Date of Patent: Jul. 26, 1994

[54] INTEGRATED CIRCUIT PACKAGE HAVING AN INTERPOSER

[75] Inventors: Louis Liang, Los Altos; Sang S. Lee, Sunnyvale; Young I. Kwon, San Jose, all of Calif.

[73] Assignee: VLSI Technology, Inc., San Jose, Calif.

[21] Appl. No.: 815,097

[22] Filed: Dec. 27, 1991

[51] Int. Cl.⁵ .................. H01L 23/02; H01L 23/28
[52] U.S. Cl. .................. 174/52.4; 361/736; 361/752; 361/813; 174/52.2; 257/676; 257/700; 257/787
[58] Field of Search ............ 257/666, 676, 690, 700, 257/787; 174/52.2, 52.3, 52.4; 361/421, 728, 736, 748, 752, 760, 761

[56] References Cited

U.S. PATENT DOCUMENTS 4,714,952 12/1987 Takekawa et al. .................. 361/421

FOREIGN PATENT DOCUMENTS 61-10263  1/1986  Japan .................. 257/676
3191560  8/1991  Japan .................. 257/676

*Primary Examiner*—Leo P. Picard
*Assistant Examiner*—Bot Ledinh
*Attorney, Agent, or Firm*—Hickman & Beyer

[57] ABSTRACT

An integrated circuit package characterized by an interposer including a thin, flexible, planar insulator having a plurality of substantially radial traces provided on one side thereof. The other side of the insulator is attached to the die attach pad of a lead frame, and an integrated circuit die is attached within a die attach area of the assembly. A first set of wires couples bonding pads of the die to the traces, and a second set of wires couples the traces to bonding fingers of the lead frame. The bonding fingers, interposer, die, and both sets of wires are then encapsulated in plastic. The interposer can be advantageously manufactured in a tape automated bonding (TAB) process to provide a low cost, high performance, and versatile lead frame assembly.

17 Claims, 3 Drawing Sheets

INTEGRATED CIRCUIT PACKAGE HAVING AN INTERPOSER

BACKGROUND OF THE INVENTION

This invention relates generally to integrated circuits, and more particularly to integrated circuit packaging.

The term "integrated circuit" usually refers to an integrated circuit die and its associated package. A common way to package an integrated circuit die is to attach it to a lead frame and then to encapsulate it within plastic. A typical lead frame includes a die attach area and a number of bonding fingers which are electrically coupled to the die by bonding wires.

Integrated circuit dies are being designed with smaller and smaller feature sizes to increase the performance and to reduce the cost of the integrated circuit. An integrated circuit die having smaller feature sizes will usually end up being smaller than a functionally equivalent integrated circuit die having larger feature sizes. While integrated circuit die tend to be shrinking, integrated circuit package sizes are commonly fixed by standards and conventions.

A yield problem occurs when small die are packaged within lead frames designed for larger die. Since the die is physically smaller, longer bonding wires are required to electrically connect the die to the bonding fingers of the lead frame. These long bonding wires can be quite flexible and have the tendency to short out with adjacent wires due to an intrinsic twist of the bonding wires or during the encapsulation process.

One solution to this problem is to make lead frames which accommodate smaller die sizes. This tends to be an expensive solution because the bonding fingers of the lead frame become so small and so closely spaced that the lead frames can no longer be economically stamped out but, rather, must be manufactured by an expensive etching process.

Another solution to this problem is to use what is known as an interposer. With an interposer, a number of intermediate bonding islands are provided on the die attach pad of the lead frame so that the die can be wired to the bonding fingers in two jumps. This is accomplished by wiring the bonding pads of the die to the bonding islands of the interposer with a first (inner) set of wires, and wiring the bonding islands to the bonding fingers of the lead frame with a second (outer) set of wires. By making the connection between the die and the bonding fingers in two jumps, the long, direct connection wires have been replaced by two sets of shorter wires. These shorter wires are less likely to short against adjacent wires than their longer counterparts.

Prior art interposers are essentially small printed circuit boards having a relatively thick, rigid, insulating substrate upon which the conductive islands are formed. The printed circuit boards are attached to the die attach pad of the lead frame, and are provided with a central aperture to accommodate the attachment of an integrated circuit die through the interposer to the die attach pad.

While the prior art interposers perform their function admirably, they do have an number of drawbacks. First, they are relatively expensive devices because they are, essentially, miniature printed circuit boards. Also, since the size of the die aperture is fixed, a particular interposer can only be used for a small range of die sizes. Obviously, an interposer cannot be effectively used when the die size is larger than the size of the die aperture. If an interposer was used with a die much smaller than the size of the die aperture the inner set of wires must be made longer, reducing the effectiveness of the interposer. Another drawback with prior art interposers is that the bonding islands have an intrinsic inductance which can degrade high-frequency performance of the integrated circuit.

The prior art does not, therefore, disclose an interposer for integrated circuit packages which increases the yield of functional integrated circuits, which is economical to produce, which has superior high-frequency performance, and which can accommodate integrated circuit die having a range of sizes.

SUMMARY OF THE INVENTION

The present invention comprises an integrated circuit lead frame assembly including a conventional lead frame and a thin interposer attached to the die attach pad of the lead frame. The interposer includes a thin, flexible, planar insulator having a first side attached to the die attach pad, and a second side provided with a plurality of conductive traces. The traces extend from a centrally located die attach area of the assembly towards the edges of the insulator.

The invention also includes an integrated circuit assembly including the lead frame assembly described above combined with an integrated circuit die attached within the die attach area, a first plurality of wires coupling the die to the plurality of traces, a second plurality of wires coupling the die to the plurality of bonding fingers, and means for encapsulating the bonding fingers, the interposer, the die, and the first and second plurality of wires.

A method of the present invention for packaging an integrated circuit die includes the steps of preparing an interposer having a thin, flexible, planar insulator provided with a plurality of traces on one side, attaching the other side of the insulator to the die attach pad of a lead frame, attaching an integrated circuit die within a die attach area of the assembly, wiring the die to the conductive traces with a first plurality of wires, wiring the traces to bonding finger of the lead frame with a second plurality of wires, and encapsulating the bonding fingers, the interposer, the integrated circuit die, and the first and second plurality of wires within an electrically insulating material. Optionally, the first plurality of wires can be coated with an insulating material prior to the encapsulating step.

The interposer can be advantageously made by a tape automated bonding (TAB) process. The resulting interposer is less expensive than the prior art printed circuit board type interposer.

The present interposer has superior high-frequency performance because the traces are closer to the conductive die attach pad of the lead frame than are the traces of prior art printed circuit board type interposers. This close spacing to a ground-plane reduces the intrinsic inductance of the traces and thereby increases the high-frequency performance of the integrated circuit.

Another advantage of the present invention is that a single interposer can accommodate a range of die sizes. Since the traces extend substantially radially outwardly from the die attach area, larger die simply overlap more of the inner ends of the traces than small die. The length of the inner leads can therefore be the same for small and large die within the range of die sizes.

Since the interposer is flexible, it can conform more closely to the surface of the die attach pad of the lead frame. This allows better adhesion of the interposer to the die attach pad than the rigid interposers of the prior art, and helps insure that the plane of the interposer is parallel to the planes of the die attach pad and bonding fingers.

A still further advantage of this invention is that standard lead frames and encapsulation processes can be used. The majority of the customization of the package involves the interposer, and these interposers can be designed at the packaging site rather than by outside vendors or by the manufacturers of the lead frames. This can greatly reduce cycle time and costs.

These and other advantages of the present invention will become apparent to those skilled in the art upon a reading of the following specification of the invention and a study of the several figures of the drawing.

DETAILED DESCRIPTION OF THE PREFERRED EMBODIMENTS

Figure 1:
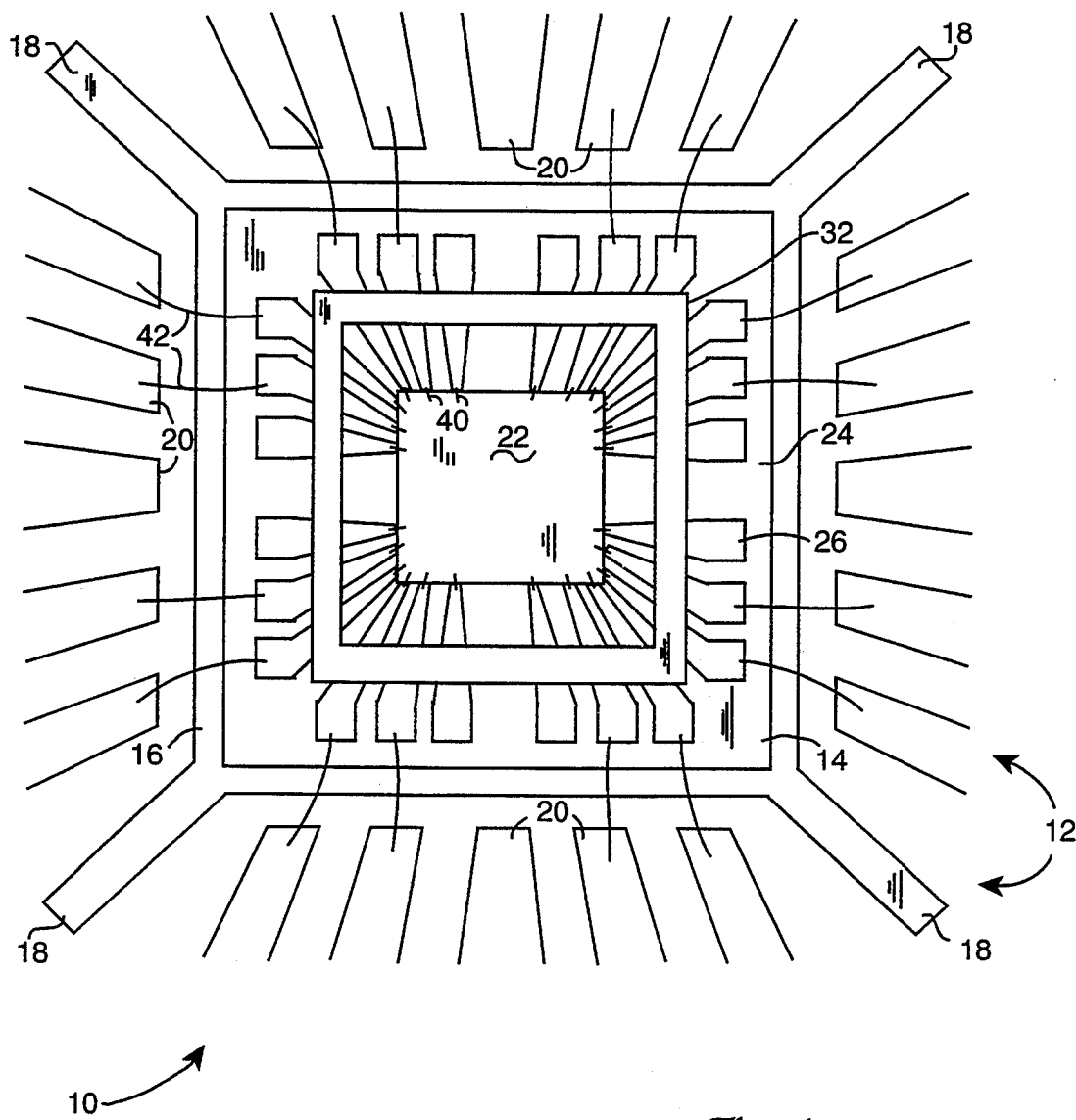
FIG. 1 is a partial top plan view of a lead frame assembly in accordance with the present invention.

In FIG. 1, an integrated circuit (IC) lead frame assembly 10 in accordance with the present invention includes a lead frame 12 and an interposer 14. The lead frame 12 includes a die attach pad 16 supported by four support arms 18, and a number of bonding fingers 20 terminating near the die attach pad 16. An IC die 22 is attached to the assembly 10, as will be discussed in greater detail subsequently.

Figure 2:
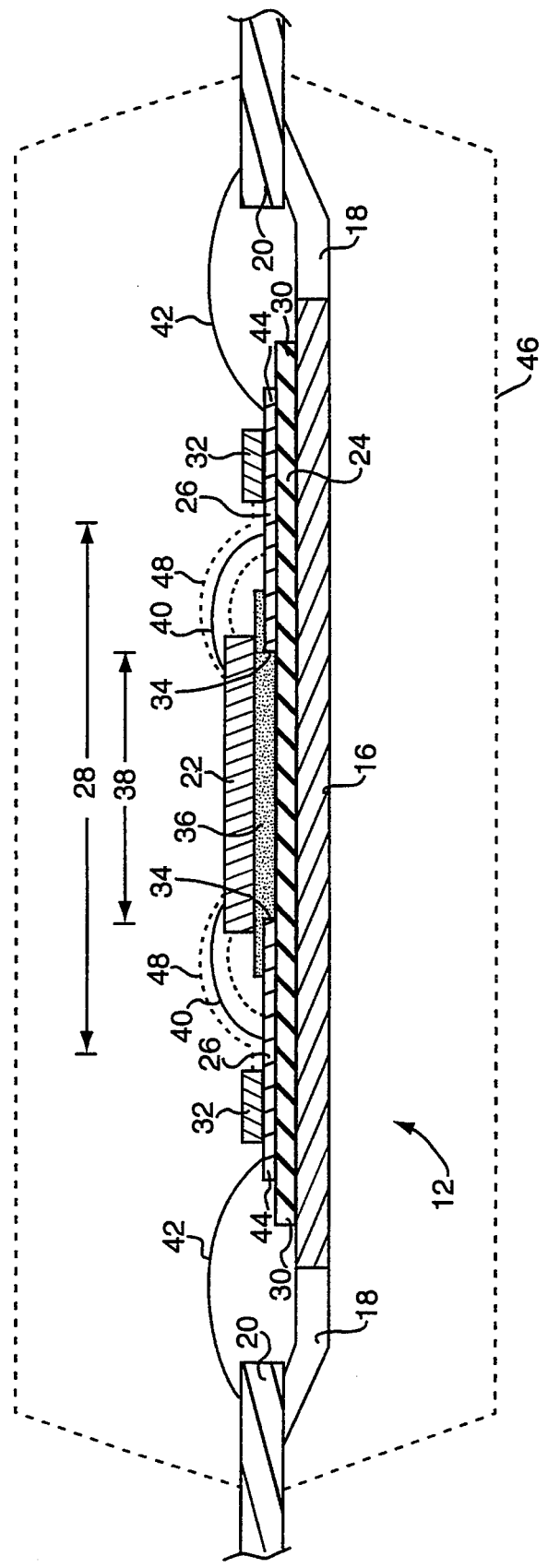
FIG. 2 is a cross-sectional view of an integrated circuit assembly in accordance with the present invention.

With additional reference to FIG. 2, the lead frame 12 is preferably a standard, commercial unit available from such sources as Mitsui High Tec. A typical lead frame 12 has a die attach pad 16 which is approximately 11.4 millimeters square, and is provided with 160 bonding fingers 20 to provide a 160 pin IC package. The lead frame 12 is made from a material which is a good conductor, such as copper, so that the bonding fingers 20 provide a low electrical resistance path for signals to and from the IC die 22, and so that the die attach pad 16 serves as an electromagnetic shield for the back-side of IC die 22, thereby minimizing cross-talk and other interferences. As best seen in FIG. 2, the arms 18 are bent downwardly from the plane of the bonding fingers 20 such that the die attach pad 16 is in a lower, parallel plane than the plane of the bonding fingers 20. This arrangement brings the IC die 22 into an approximately coplanar position with respect to the plane of the bonding fingers 20 to facilitate the bonding of wires between the bonding fingers 20 and the IC die 22.

With continuing reference to FIGS. 1 and 2, the interposer 14 of the present invention includes a thin, flexible, planar insulator 24 attached to the upper surface of die attach pad 16, preferably with a process compatible adhesive. The insulator 24 is typically a plastic material such as polyimide and is approximately 0.1 millimeters thick. The upper surface of insulator 24 is provided with a number of conductive traces 26 which extend somewhat radially outwardly from a central location of the insulator 24. The conductive traces 26 are preferably made from copper, are about 0.05 millimeters thick, and extend from a centrally located die attach area 28 towards the edges 30 of the insulator 24.

As best seen in FIG. 1, the traces 26 are narrower towards their inner ends and are wider towards their outer ends. This configuration provides a higher lead density near the IC die 22 and large, low electrical resistance pads near bonding fingers 20. The traces are approximately 0.05 millimeters wide at their inner ends, 0.1 millimeters wide at their outer ends, with an average width of about .075 millimeters. As shown in FIG. 1, the conductive traces 26 are not entirely radial in their positioning but, rather, are somewhat radial in their extension. The interposer 14 is preferably provided with a tape dam 32 which surrounds the IC die 22 outside of the die attach area 28. The interposer may be provided with a central aperture through the insulator 24 to permit the bottom side of the IC die to be additionally bonded to the die attach pad 16 of the lead frame.

The interposer 14 can be conveniently made by a tape automated bonding (TAB) process. Vendors such as the 3M Corporation of Minneapolis, Minn. can custom manufacture TAB structures in rolls of tape resembling 35 millimeter photographic film. Individual interposers 14 are cut from the rolls of tape by either an automatic or a manual process, and are then individually attached to a die attach pad 16 to provide the lead frame assembly 10 of the present invention.

The IC die 22 is attached over the ends 34 of traces 26 within the die attach area 28, preferably with a process compatible adhesive 36. The adhesive 36 should be an insulating adhesive to prevent an electrical path from the bottom of IC die 22 to the traces 26, or to the die attach pad 16 if the interposer is provided with a central aperture. As best seen in FIG. 2, the ends 34 of the traces 26 extend well into the die attach area 28 permitting larger or smaller die to be attached over the traces with more or less overlap, respectively, of the ends 34. The upper size of an IC die 22 is limited by the tape dam 32, while the lower size of the IC die 22 is preferably limited by the spacing 38 between the ends 34 of the traces 26 although, in some embodiments, an IC die can be smaller than the spacing 38.

The IC die 22 is coupled to the bonding fingers 20 by a first (inner) set of bonding wires 40 and a second (outer) set of bonding wires 42. The first set of bonding wires 40 connect bonding pads on the IC die 22 to portions of the traces 26 which are just outside of the perimeter of the die. This keeps the bonding wires 40 short and therefore more resistant to shorting out against adjacent bonding wires. The second set of bonding wires 42 connect the traces 26 to the bonding fingers 20. The bonding wires 42 are connected near to the outer ends 44 of the traces 26 and near to the ends of bonding fingers 20 to, again, minimize the length of the wires.

As with any double-jump bonding scheme, the use of two sets of short wires instead of using one set of long bonding wires greatly reduces the problem of electrical shorts between adjacent wires. The present invention reduces the problem to an even greater extend by using the somewhat radial conductive traces 26 as an intermediate conductor between the first and second sets of wires to further reduce their lengths. The somewhat radial conductive traces also permit die of various sizes to be used with a particular interposer while still maintaining a short first set of wires. In addition, since the short length of the first set of wires reduces the chance of electrical shorts between adjacent wires, the distance between adjacent bonding pads (i.e. the pitch) of the IC die 22 can be reduced to increase the number of input/output (I/O) pads available on the die. This is very desirable because there is a direct relationship between the functionality and power of an integrated circuit its number of inputs and outputs.

The first set of wires 40 can be relatively small in diameter. For example, the inner set of wires 40 can be made from 0.001 inch diameter gold wire. A small diameter wire permits smaller bonding pads on IC die 22, thereby further increasing I/O density of the die. In contrast, the second set of wires 42 are relatively larger in diameter (e.g. 0.0013 inch) gold wire which lowers the inductance and increases the stiffness of the wire. The lower inductance can improve the electrical performance of the assembly and the increased stiffness further helps to reduce the electrical shorting problem between adjacent wires. The first and second set of wires can be attached to the assembly with commercially available wire bonders, such as the 1484 TS model wire bonder made by Kulicke & Soffa of Willow Grove, Penn.

The design of the interposer 14 creates a very high performance interconnect between the first set of wires 40 and the second set of wires 42. As noted above, the traces 26 are relatively wide to present minimal electrical resistance. Furthermore, since the insulator 24 is only about 0.1 millimeters thick, the traces 26 are very closely separated from the conductive die attach pad 16, which serves as a groundplane. This close separation greatly reduces the inductance of the traces in contrast to prior art printed circuit board type interposers.

After the first set of wires 40 and the second set of wires 42 are attached, the assembly is ready for encapsulation. The encapsulation material 46 is typically a thermoset material such as Sumitomo 6300HS, and encapsulates the die 22, the wires 40 and 42, and the majority of the lead frame 12. The remaining, exposed portion of the lead frame is formed into the leads of the integrated circuit.

Optionally, the first set of wires 40 can be coated with an insulating material 48 prior to encapsulating the assembly in encapsulation material 46. The tape dam 32 confines the insulating material 48 to prevent the insulating material from coating the outer ends of the traces 26. The insulating material 48 provides further protection against the inadvertent shorting of adjacent wires and permits a more robust type of encapsulation process, such as transfer molding.

Figure 3:
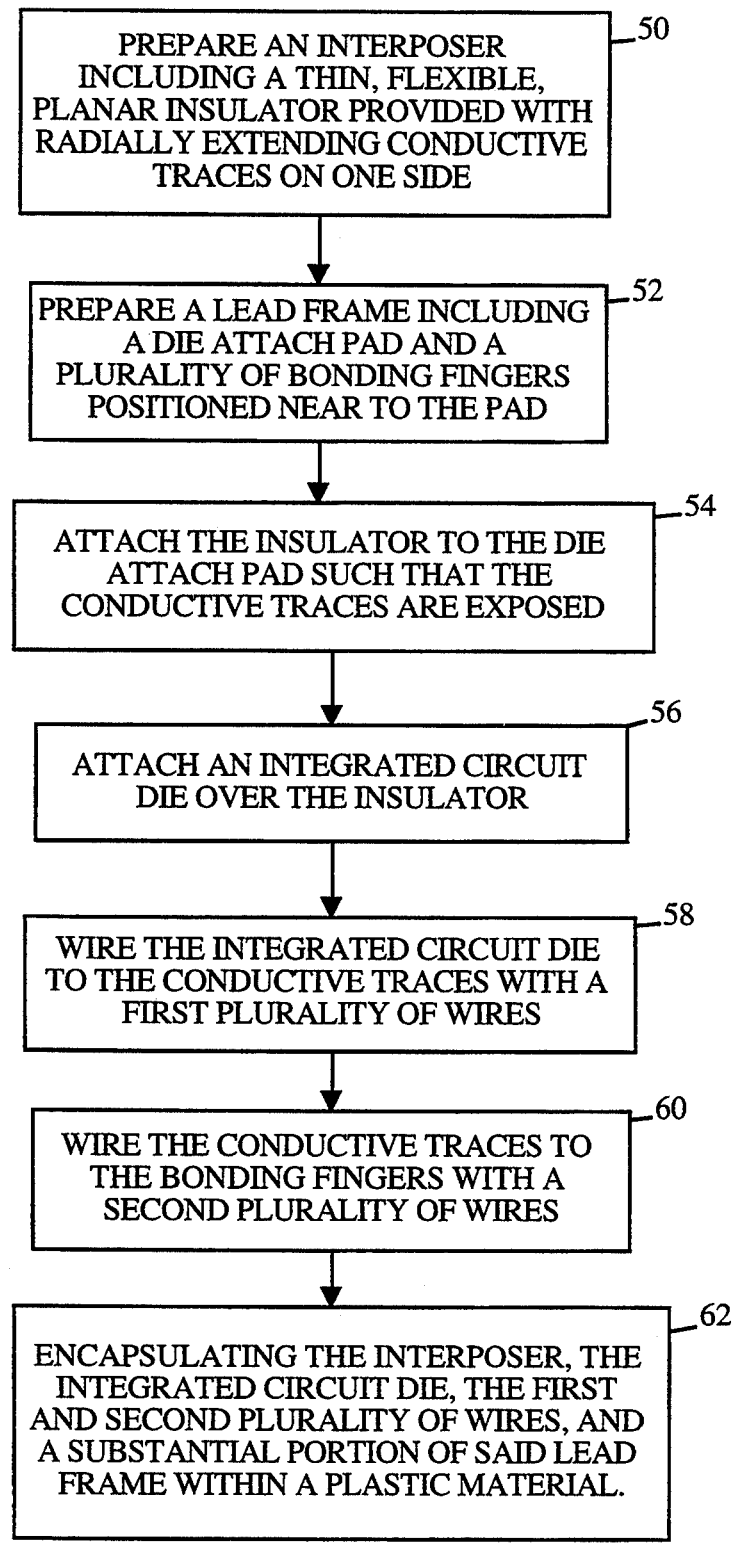
FIG. 3 illustrates the method of the present invention for packaging an integrated circuit die.

In FIG. 3, the process of the present invention includes a first step 50 of providing an interposer including a thin, flexible planar insulation provided with generally radially extending conductive traces on one side. In a step 52, a lead frame is prepared having a die attach pad and a plurality of bonding fingers positioned near to the pad. The insulator is attached to the die attach pad in a step 54 such that the conductive traces are exposed. An integrated circuit die is attached over the insulator in a step 56, and the die is wired to the conductive traces of the interposer with a first plurality of wires in a step 58. The conductive traces are then wired to the bonding fingers of the lead frame with a second plurality of wires in a step 60, and the assembly is encapsulated in a step 62. As an alternative step (not shown) the first plurality of wires can be coated with an insulating coating prior to the encapsulation step 62.

While this invention has been described in terms of several preferred embodiments, it is contemplated that alterations, modifications and permutations thereof will become apparent to those skilled in the art upon a reading of the specification and study of the drawings. It is therefore intended that the following appended claims include all such alterations, modifications and permutations as fall within the true spirit and scope of the present invention.

What is claimed is:

1. An integrated circuit lead frame assembly comprising:
   (a) a lead frame including a die attach pad and a plurality of bonding fingers positioned proximate to said die attach pad; and
   (b) interposer means including
      (i) a thin, flexible, planar insulator having a first side attached to said die attach pad; and
      (ii) a plurality of conductive traces provided on a second side of said insulator which extend from a centrally located die attach area of said assembly towards the edges of said insulator, each of said conductive traces having an inner end and an outer end, wherein said inner ends terminate proximate said die attach area and said outer ends terminate proximate to said edges of said insulator, and wherein said inner ends are narrower in width than said outer ends.

2. An integrated circuit lead frame assembly as recited in claim 1 wherein at least the portion of said die attach pad to which said insulator is attached is conductive, thereby reducing the intrinsic inductances of said plurality of traces.

3. An integrated circuit lead frame assembly as recited in claim 2 wherein said insulator is less than about 0.1 millimeter thick.

4. An integrated circuit lead frame assembly as recited in claim 1 wherein said insulator is adhesively attached to said die attach pad.

5. An integrated circuit lead frame assembly as recited in claim 1 wherein said insulator is provided with a centrally located aperture, thereby exposing a surface of said die attach pad.

6. An integrated circuit lead frame assembly as recited in claim 1 wherein said plurality of conductive traces extend generally radially outwardly from said centrally located die attach area.

7. An integrated circuit lead frame assembly as recited in claim 1 wherein said conductive traces are substantially planar.

8. An integrated circuit lead frame assembly as recited in claim 1 further comprising a dam formed around said die attach area and over said plurality of traces.

9. An integrated circuit assembly comprising:
   (a) a lead frame including a die attach pad and a plurality of bonding fingers positioned proximate to said die attach pad;
   (b) interposer means including
      (i) a thin, flexible, planar insulator having a first side attached to said die attach pad; and
      (ii) a plurality of substantially planar conductive traces provided on a second side of said insulator which extend from a centrally located die attach area of said assembly towards the edges of said insulator, each of said conductive traces having an inner end and an outer end, wherein said inner ends terminate proximate said die attach area and said outer ends terminate proximate to said edges of said insulator, and wherein said inner ends are narrower in width than said outer ends;

(c) an integrated circuit die attached within said die attach area;

(d) a first plurality of wires coupling said integrated circuit die to said plurality of traces;

(e) a second plurality of wires coupling said plurality of traces to said plurality of bonding fingers; and (f) means for encapsulating said bonding fingers, said interposer means, said integrated circuit die, and said first and second plurality of wires.

10. An integrated circuit assembly as recited in claim 9 wherein said integrated circuit die is adhesively attached to said insulator by an electrically insulating adhesive.

11. An integrated circuit assembly as recited in claim 10 wherein said insulator is provided with a centrally located aperture and wherein said integrated circuit die is adhesively attached to said die attach pad by an electrically insulating adhesive.

12. An integrated circuit assembly as recited in claim 9 wherein said plurality of conductive traces extend generally radially outwardly from said centrally located die attach area.

13. An integrated circuit assembly as recited in claim 12 wherein each of said plurality of conductive traces have an inner end and an outer end, and wherein said inner ends terminate within said die attach area and beneath said integrated circuit die and said outer ends terminate proximate to edges of said insulator.

14. An integrated circuit assembly as recited in claim 13 further comprising a dam formed around said die attach area and over said plurality of traces.

15. An integrated circuit assembly as recited in claim 14 further comprising means for coating said first plurality of wires within said dam.

16. An integrated circuit assembly as recited in claim 9 wherein said first plurality of wires are of a smaller diameter than said second plurality of wires.

17. An integrated circuit assembly as recited in claim 9 wherein the average separation between adjacent wires of said first plurality of wires is less than the average separation between adjacent wires of said second plurality of wires.

* * * * *